United States Patent [19]

Harvey et al.

[11] Patent Number: 5,895,245
[45] Date of Patent: Apr. 20, 1999

[54] PLASMA ASH FOR SILICON SURFACE PREPARATION

[75] Inventors: Ian Robert Harvey, Livermore; Xi-Wei Lin, Fremont, both of Calif.; Ramiro Solis, Bandera, Tex.

[73] Assignee: VLSI Technology, Inc., Mountain View, Calif.

[21] Appl. No.: 08/877,095

[22] Filed: Jun. 17, 1997

[51] Int. Cl.⁶ .................................................. H01L 21/336
[52] U.S. Cl. .......................... 438/305; 438/683; 438/719; 438/906; 438/952; 438/963
[58] Field of Search .................................. 438/906, 683, 438/952, 719, 963

[56] References Cited

U.S. PATENT DOCUMENTS

| | | |
|---|---|---|
| 4,808,259 | 2/1989 | Jillie, Jr. et al. . |
| 4,897,154 | 1/1990 | Chakravarti et al. . |
| 5,236,868 | 8/1993 | Nulman . |
| 5,296,093 | 3/1994 | Szwejkowski et al. . |
| 5,403,434 | 4/1995 | Moslehi . |
| 5,453,156 | 9/1995 | Cher et al. . |
| 5,762,755 | 12/1992 | McNeilly et al. . |

*Primary Examiner*—John F. Niebling
*Assistant Examiner*—Jonathan Hack
*Attorney, Agent, or Firm*—Wagner, Murabito&Hao

[57] ABSTRACT

A method for preparing a semiconductor substrate and a polysilicon gate for subsequent silicide formation. In one embodiment, the present invention performs an oxide etch to remove oxide from source and drain diffusion regions of the semiconductor substrate and from the top surface of the polysilicon gate. Next, the present invention subjects the semiconductor substrate and the polysilicon gate to an ashing environment. In the present invention, the ashing environment is comprised of $H_2O$ vapor, and a gaseous fluorocarbon or a fluorinated hydrocarbon gas. In so doing, contaminants introduced into the source and drain diffusion regions of the semiconductor substrate and into the top surface of the polysilicon gate during the oxide etch are removed. Next, the present invention performs a semiconductor wafer surface clean step. The semiconductor wafer surface clean step provides a semiconductor wafer surface which is substantially similar to a virgin silicon surface. As a result, the source and drain diffusion regions of the semiconductor substrate and the top surface of the polysilicon gate are prepared for subsequent silicide formation therein.

19 Claims, 3 Drawing Sheets

5,895,245

PLASMA ASH FOR SILICON SURFACE PREPARATION

TECHNICAL FIELD

The present claimed invention relates to the field of semiconductor device fabrication. More specifically, the present claimed invention relates to a method for preparing a semiconductor surface for subsequent silicide formation therein.

BACKGROUND ART

During conventional semiconductor manufacturing processes, unwanted materials are formed on the semiconductor wafer and on features formed on the semiconductor wafer. Usually, these unwanted materials must be removed or etched from the semiconductor wafer. Unfortunately, not all unwanted materials are easily removed or etched from the semiconductor wafer or the features formed on the semiconductor wafer.

With reference now to Prior Art FIG. 1, a cross sectional view illustrating a step associated with a prior art semiconductor device formation method is shown. In a conventional salicidation process, a semiconductor substrate 102 has at least one source diffusion region 104 and at least one drain diffusion region 106 formed therein. A polysilicon gate 108 is disposed between source diffusion region 104 and drain diffusion region 106. In one prior art approach, an oxide etch (i.e. a lightly doped drain (LDD) spacer etch) is used to remove oxide residing above source diffusion region 104 and drain diffusion region 106 of semiconductor substrate 102. The LDD spacer etch also forms sidewall spacers 110$a$ and 110$b$ along the sides of polysilicon gate 108. Unfortunately, conventional process steps contaminate source diffusion region 104, drain diffusion region 106, and the top surface of polysilicon gate 108 such that they are not well suited for the formation of silicided regions therein. (Although an LDD spacer etch is specifically recited as causing contamination during conventional process steps, such contamination also results from various other oxide etch steps stopping on silicon, wherein a subsequent silicidation step will occur such as, for example, a contact etch.)

Referring next to Prior Art FIG. 2, a cross sectional view illustrating deleterious polymer deposition associated with a prior art semiconductor device formation method is shown. As shown in Prior Art FIG. 2, conventional oxide etch steps result in the contamination of source diffusion region 104, drain diffusion region 106, and the top surface of polysilicon gate 108. Such contamination is indicated by areas 200 in source diffusion region 104, areas 202 in drain diffusion region 106, and areas 204 in the top surface of polysilicon gate 108. The contamination results when free $CF_x$ species fluorine or free fluorine radicals from the plasma bombard the silicon of source diffusion region 104, drain diffusion region 106, and the top surface of polysilicon gate 108. As a result of the bombardment, a Teflon-like polymer, $[C_2F_4]_n$, (e.g. as represented by areas 200, 202, and 204) is formed at the silicon surface of source diffusion region 104, drain diffusion region 106, and the top surface of polysilicon gate 108. In addition, the kinetic energy imparted by the plasma embeds the carbon-flourine polymer several atomic layers deep into the silicon surface forming a polymer-coated, carbon/fluorine-embedded silicon damage layer.

Referring still to Prior Art FIG. 2, contaminant areas 200, 202, and 204 prevents the formation of a continuous layer of metal over source diffusion region 104, drain diffusion region 106, and the top surface of polysilicon gate 108 during subsequent salicidation process steps. The metal is not in close with silicon, and the polymer creates an effective diffusion barrier preventing the two metals from forming an alloy. Hence, contaminant areas 200, 202, and 204 degrade the characteristics of the silicided regions produced after annealing of the discontinuous metal layer. Although numerous attempts have been made to remove the contaminants using wet chemical etches, dips, and plasma ashes (e.g. a hydrofluoric acid dip/soak, an oxygen plasma ash, a sulfuric acid etch/clean), none of these conventional approaches has proven to be sufficiently reproducible to give an acceptable margin of manufacturability.

Thus, the need has arisen for a method to prepare a semiconductor substrate and a polysilicon gate for subsequent silicide formation.

DISCLOSURE OF THE INVENTION

The present invention provides a method for preparing a semiconductor substrate and a polysilicon gate for subsequent silicide formation. The present invention achieves the above accomplishment with an ashing method which utilizes an ashing environment comprising $H_2O$ vapor, and a gaseous fluorocarbon or a fluorinated hydrocarbon gas, to obtain a semiconductor wafer surface which is substantially similar to a virgin silicon surface.

Specifically, in one embodiment of the present invention, the present invention performs an oxide etch to remove oxide from source and drain diffusion regions of the semiconductor substrate and/or from the top surface of the polysilicon gate. Next, the present invention subjects the semiconductor substrate and the polysilicon gate to an ashing environment. In the present invention, the ashing environment is comprised of $H_2O$ vapor, and a gaseous fluorocarbon or a fluorinated hydrocarbon gas. In so doing, contaminants introduced into the source and drain diffusion regions of the semiconductor substrate and into the top surface of the polysilicon gate during the oxide etch are modified for complete removal by an acid. Next, the present invention performs a semiconductor wafer surface clean step. The semiconductor wafer surface clean step provides a semiconductor wafer surface which is substantially similar to a virgin silicon surface. As a result, the source and drain diffusion regions of the semiconductor substrate and the top surface of the polysilicon gate are prepared for subsequent silicide formation therein.

In another embodiment, the present invention further includes a method for forming a salicided region in a semiconductor substrate and in the top surface of a polysilicon gate. In such an embodiment, the present invention performs the steps of the previous embodiment, and further deposits a metal layer over the semiconductor substrate. The metal layer is deposited onto the source and drain diffusion regions of the semiconductor substrate and onto the top surface of the polysilicon gate. Next, the present embodiment anneals the metal layer such that metal-silicide alloy is formed into the source and drain diffusion regions of the semiconductor substrate and into the top surface of the polysilicon gate. Thus, the present embodiment of the invention provides for the formation of uniform and intact silicide regions.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
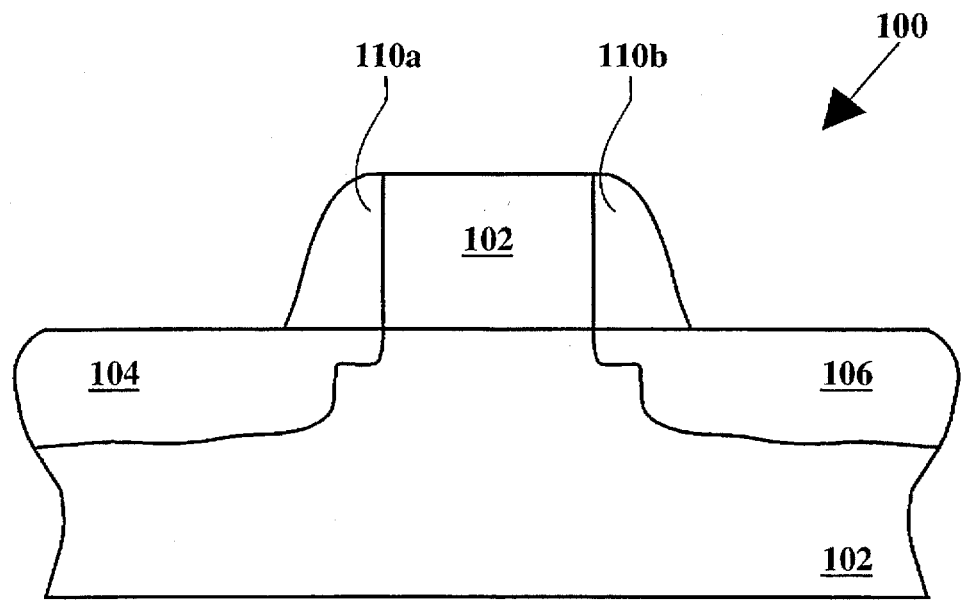
FIG. 1 is a cross sectional view illustrating a step associated with a prior art semiconductor device formation method.
Figure 2:
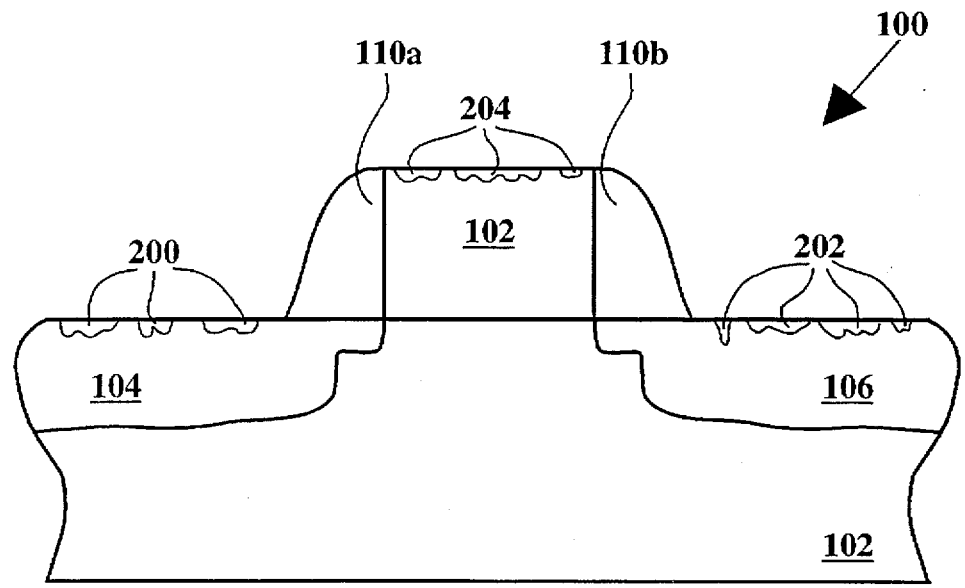
FIG. 2 is a cross sectional view illustrating deleterious polymer deposition associated with a prior art semiconductor device formation method.
Figure 3:
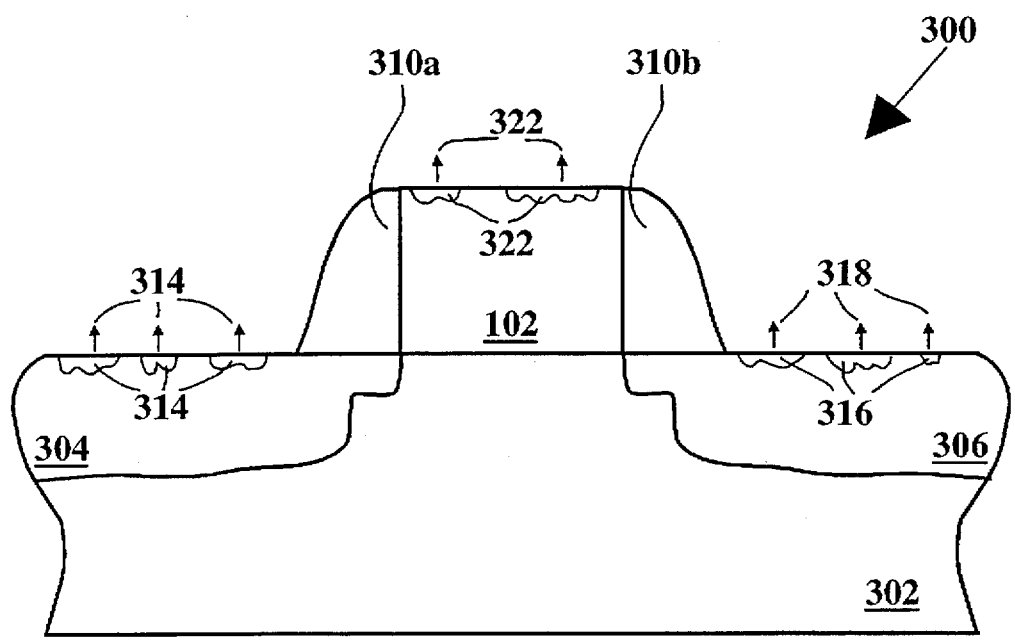
FIG. 3 is a cross sectional view illustrating a polymer removal step in accordance with the present claimed invention.

With reference now to FIG. 3, a cross sectional view of a semiconductor substrate 300 having features formed thereon is shown. In the present embodiment, a semiconductor substrate 302 has at least one source diffusion region 304 and at least one drain diffusion region 306 formed therein. A polysilicon gate 308 is disposed between source diffusion region 304 and drain diffusion region 306. In the embodiment of FIG. 3, an oxide etch (i.e. a lightly doped drain (LDD) spacer etch) is used to remove oxide residing above source diffusion region 304 and drain diffusion region 306 of semiconductor substrate 302. Such oxide etch steps are typically performed using etchants selected from the group consisting of $CF_4$ and $CHF_3$ or similar polyfluorinated hydrocarbons. The LDD spacer etch also forms sidewall spacers 310a and 310b along the sides of polysilicon gate 308. As mentioned above, after an oxide etch step, source diffusion region 304, drain diffusion region 306, and the top surface of polysilicon gate 308 are contaminated such that they are not well suited for the formation of silicided regions therein.

In FIG. 3, the contamination resulting from the oxide etch is indicated by areas 312 in source diffusion region 304, areas 316 in drain diffusion region 306, and areas 320 in the top surface of polysilicon gate 308. As described in detail below, the present invention effectively and efficiently removes such contamination to provide a semiconductor wafer surface which is substantially similar to a virgin silicon surface. Thus, the present invention provides source and drain diffusion regions and a top surface of a polysilicon gate which are prepared for subsequent silicide formation therein. (Although the present embodiment specifically recites removing contamination resulting from an LDD spacer etch, the present invention is also well suited removing such contamination resulting from various other oxide etch steps stopping on silicon such as, for example, a contact etch or nitride diffusion etch.)

In the present embodiment, after an oxide etch step, semiconductor wafer 302 is placed in an ashing environment such as, for example, a reactive ion etching chamber. Although such an ashing environment is used in the present embodiment, the present invention is also well suited to the use of various other well known ashing environments. In the present embodiment, the ashing environment operates at a pressure of approximately 1.2 Torr and a power of approximately 1000 Watts.

The present embodiment introduces $H_2O$ and $CF_4$ into the ashing environment. The present embodiment introduces $H_2O$ at a flow rate of approximately 300 standard cubic centimeters per minute (SCCM). $CF_4$ is introduced at a flow rate of approximately 180 SCCM, in the present embodiment (In another embodiment, the present invention introduces a gaseous polyfluorocarbons such as $C_2F_6$, or fluorinated hydrocarbons such as $CHF_3$ instead of $CF_4$, into the ashing environment at a flow rate of approximately 180 SCCM). Although such flow rates are used in the present embodiment, the present invention is also well suited to varying the flow rates of the gases which are introduced into the ashing environment.

In the present invention, the ashing environment comprising $H_2O$ vapor and the gaseous fluorocarbon or a fluorinated hydrocarbon gas, efficiently and thoroughly transforms the polymer contaminants introduced into source diffusion region 304, drain diffusion region 306, and the top surface of polysilicon gate 308, into residues which are easily and completely removed by an acid immersion. More specifically, the method of the present invention removes unwanted Teflon-like polymers deposited into source diffusion region 304, drain diffusion region 306, and the top surface of polysilicon gate 308. In the present invention, the transformation is facilitated by the polymer breaking action of the OH species in the plasma. The removal of carbon atoms of the Teflon-like polymer is facilitated by the presence of oxygen in the present ashing environment, becoming volatile CO. Similarly, the removal of fluorine atoms of the Teflon-like polymer is facilitated by the presence of hydrogen in the present ashing environment, becoming volatile HF. Thus, the contaminants are pulled from source diffusion region 304, drain diffusion region 306, and the top surface of polysilicon gate 308. That is, the plasma ashing environment of the present invention removes the contaminants from source diffusion region 304, drain diffusion region 306, and the top surface of polysilicon gate 308 as indicated by arrows 314, 318, and 322. Hence, the present invention provides an effective and thorough contaminant removal method which is easy to implement in a manufacturing environment. The method of the present invention, unlike prior art surface preparation methods, greatly simplifies multi-step wet/dry etch sequences, dips, soaks, and the like. The present invention has made the above-described process predictable and manufacturable with wide process margin.

Figure 4:
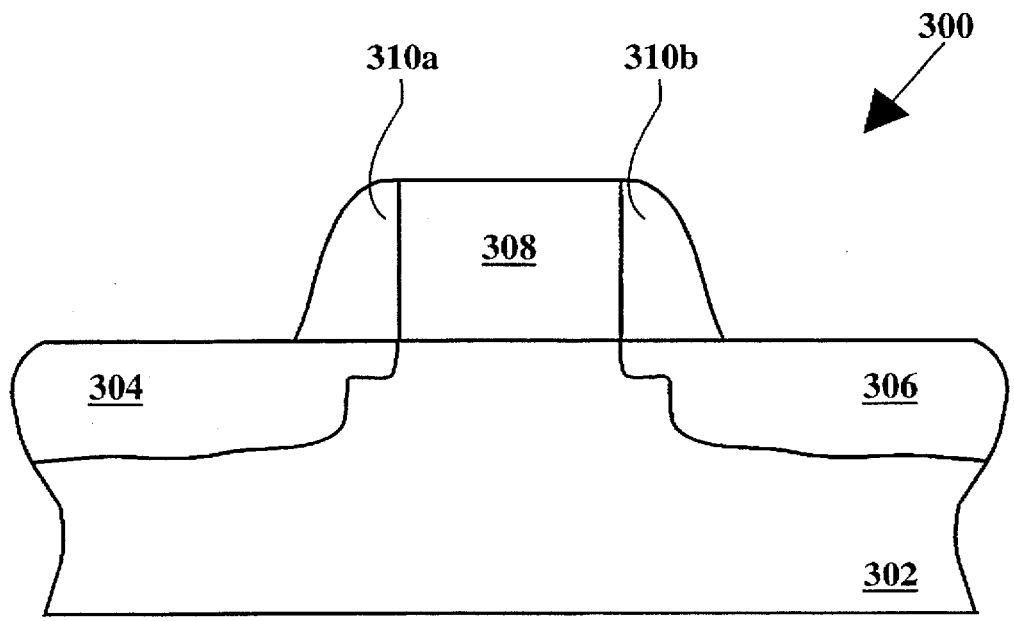
FIG. 4 is a cross sectional view illustrating a substantially virginal semiconductor substrate and polysilicon gate in accordance with the present claimed invention.

With reference still to FIG. 3, after the removal of the contaminants from source diffusion region 304, drain diffusion region 306, and the top surface of polysilicon gate 308 the present embodiment performs a semiconductor wafer surface clean step. In one embodiment, the semiconductor wafer surface clean step is comprised of a native oxide removal step which is performed using an hydrofluoric (HF) acid dip. By removing the contaminants as described above, and by performing the wafer surface clean step, the present invention provides a semiconductor wafer surface which is substantially similar to a virgin silicon surface. A virginal silicon surface substantially free of contaminants is shown in FIG. 4.

In the present embodiment, source diffusion region 304, drain diffusion region 306, and the top surface of polysilicon gate 308 can be tested using various methods in order to determine whether they are substantially similar to a virgin silicon surface. Such testing methods include, for example, water contact angle measurement (for quantification of hydrophobicity), subsequent silicide thickness measurement, sheet resistance measurement, and the like. By providing a virgin silicon surface, the present invention prepares source diffusion region 304, drain diffusion region 306, and the top surface of polysilicon gate 308 for subsequent silicide formation therein. More specifically, by removing contaminant areas 312, 316, and 320, the present invention provides for the deposition/formation of a continuous layer of metal over source diffusion region 304, drain diffusion region 306, and the top surface of polysilicon gate 308 during subsequent salicidation processes.

In another embodiment of the present invention, after preparing the surface of source diffusion region 304, drain diffusion region 306, and the top surface of polysilicon gate 308, the present invention deposits a metal layer over semiconductor substrate 302. In so doing, a layer of metal layer is deposited onto source diffusion region 304, drain diffusion region 306, and the top surface of polysilicon gate 308. In the present embodiment, the metal is comprised of titanium. Although such a metal is specifically recited in the present embodiment, the present invention is also well suited to using various other types of metals such as, for example, platinum, tungsten, cobalt, and the like.

Figure 5:
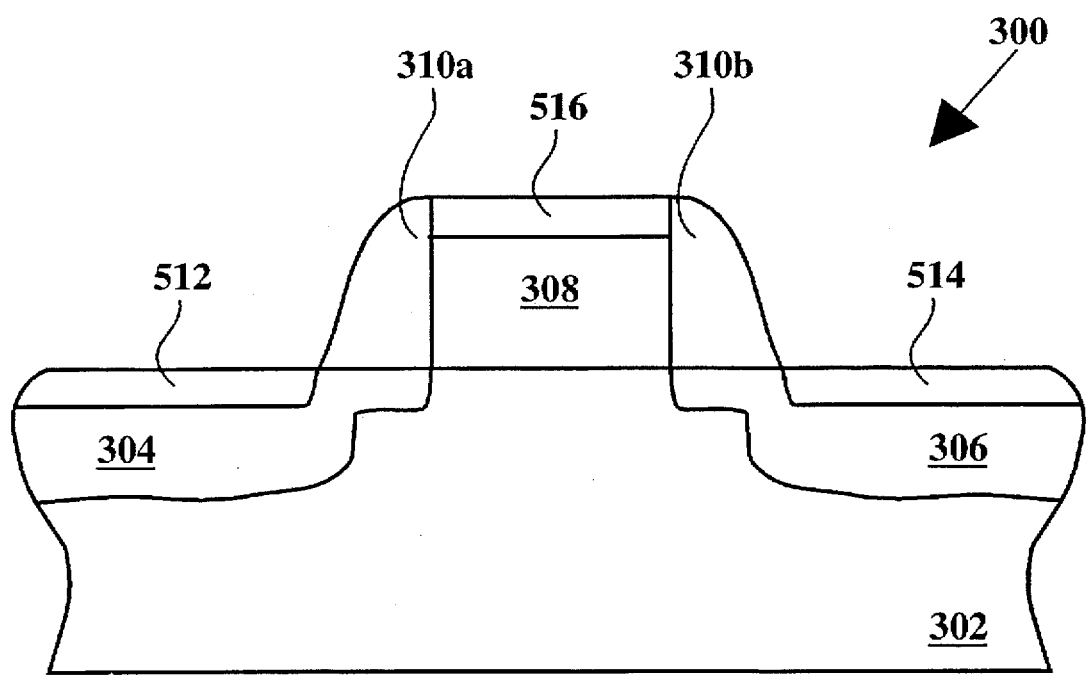
FIG. 5 is a cross sectional view illustrating silicided regions formed into the virginal semiconductor substrate and the polysilicon gate of FIG. 4 in accordance with the present claimed invention.

With reference next to FIG. 5, in the present embodiment, after the deposition of the metal layer, an annealing step is performed. This step anneals the metal layer such that silicided regions are formed into source diffusion region 304, drain diffusion region 306, and self-aligned (salicided) region at the top surface of polysilicon gate 308. The silicided regions are illustrated as region 512 in source diffusion region 304, silicided region 514 in drain diffusion region 306, and salicided region 516 in the top surface of polysilicon gate 308. As shown in FIG. 5, silicide-alloy regions 512, 514, and 516 of the present embodiment have a uniform depth and are of uniform consistency. As a result, silicide-alloy regions 512, 514, and 516 exhibit ideal electrical and resistive characteristics. As a final step in the salicidation process, the present embodiment then removes unreacted metal residing above semiconductor substrate 302.

Thus, the present invention provides a method for preparing a semiconductor substrate and a polysilicon gate for subsequent silicide formation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of preparing a semiconductor substrate and a polysilicon gate for subsequent silicide formation, said method comprising the steps of:

a) performing an oxide etch to remove oxide from source and drain diffusion regions of said semiconductor substrate and from the top surface of said polysilicon gate;

b) subjecting said semiconductor substrate and said polysilicon gate to an ashing environment, said ashing environment comprising $H_2O$ vapor, and a gaseous fluorocarbon or a fluorinated hydrocarbon gas, such that contaminants introduced into said source and drain diffusion regions of said semiconductor substrate and into said top surface of said polysilicon gate during step a) are removed or transformed; and c) performing a semiconductor wafer surface clean step to strip transformed by-products and provide a semiconductor wafer surface which is substantially similar to a virgin silicon surface such that said source and drain diffusion regions of said semiconductor substrate and said top surface of said polysilicon gate are prepared for subsequent silicide formation therein.

2. The method as recited in claim 1 wherein step a) further comprises a lightly doped drain (LDD) spacer etch.

3. The method as recited in claim 1 wherein step a) further comprises a contact etch.

4. The method as recited in claim 1 wherein step a) further comprises:

performing said oxide etch using etchants selected from the group consisting of $C_xF_y$ and $C_xH_yF_z$.

5. The method as recited in claim 1 wherein step b) removes unwanted polymers deposited into said source and drain diffusion regions of said semiconductor substrate and into said top surface of said polysilicon gate during step a).

6. The method as recited in claim 1 wherein step b) further comprises the steps of:

b1) introducing $CF_4$ into said ashing environment at a flow rate of approximately 180 SCCM; and b2) introducing $H_2O$ vapor into said ashing environment at a flow rate of approximately 300 SCCM such that said impurities introduced into said source and drain diffusion regions of said semiconductor substrate and into said top surface of said polysilicon gate during step a) are removed.

7. The method as recited in claim 1 wherein step c) further comprises the step of:

performing said surface clean step using an HF dip.

8. A method for forming a salicided region in a semiconductor substrate and in the top surface of a polysilicon gate, said method comprising the steps of:

a) performing an oxide etch to remove oxide from source and drain diffusion regions of said semiconductor substrate and from said top surface of said polysilicon gate;

b) subjecting said semiconductor substrate and said polysilicon gate to an ashing environment, said ashing environment comprising $H_2O$ vapor, and a gaseous fluorocarbon or a fluorinated hydrocarbon gas, such that contaminants introduced into said source and drain diffusion regions of said semiconductor substrate and into said top surface of said polysilicon gate during step a) are removed; and c) performing a semiconductor wafer surface clean step to provide a semiconductor wafer surface which is substantially similar to a virgin silicon surface such that said source and drain diffusion regions of said semiconductor substrate and said top surface of said polysilicon gate are prepared for subsequent silicide formation therein;

d) depositing a metal layer over said semiconductor substrate such that said metal layer is deposited onto said source and drain diffusion regions of said semiconductor substrate and onto said top surface of said polysilicon gate; and e) annealing said metal layer such that silicided regions are formed into said source and drain diffusion regions of said semiconductor substrate and into said top surface of said polysilicon gate.

9. The salicided region formation method as recited in claim 8 wherein step a) further comprises:

performing said oxide etch using etchants selected from the group consisting of $C_xF_y$ and $C_xH_yF_z$.

10. The salicided region formation method as recited in claim 8 wherein step b) removes unwanted polymers deposited into said source and drain diffusion regions of said semiconductor substrate and into said top surface of said polysilicon gate during step a).

11. The salicided region formation method as recited in claim 8 wherein step b) further comprises the steps of:

b1) introducing $CF_4$ into said ashing environment at a flow rate of approximately 180 SCCM; and b2) introducing $H_2O$ vapor into said ashing environment at a flow rate of approximately 300 SCCM such that said impurities introduced into said source and drain diffusion regions of said semiconductor substrate and into said top surface of said polysilicon gate during step a) are removed.

12. The salicided region formation method as recited in claim 8 wherein step c) further comprises the step of:

performing said surface clean step using an HF dip.

13. The salicided region formation method as recited in step d) of claim 6 wherein said metal layer is comprised of a metal selected from the group consisting platinum, tungsten, titanium, and cobalt.

14. The salicided region formation method as recited in claim 8 further comprising the step of:

f) removing unreacted portions of said metal layer.

15. A method for preparing source and drain diffusion regions of a semiconductor substrate and the top surface of a polysilicon gate for subsequent silicide formation, said method comprising the step of:

upon formation of sidewall oxide spacers, subjecting said semiconductor substrate and said polysilicon gate to an ashing environment, said ashing environment comprising $H_2O$ vapor, and a gaseous fluorocarbon or a fluorinated hydrocarbon gas, such that contaminants introduced into said source and drain diffusion regions of said semiconductor substrate and into said top surface of said polysilicon gate during said formation of said sidewall oxide spacers are removed to provide a semiconductor wafer surface which is substantially similar to a virgin silicon surface.

16. The method as recited in claim 15 wherein subjecting said semiconductor substrate and said polysilicon gate to an ashing environment removes unwanted polymers deposited into said source and drain diffusion regions of said semiconductor substrate and into said top surface of said polysilicon gate during said formation of said sidewall oxide spacers.

17. The method as recited in claim 15 wherein subjecting said semiconductor substrate and said polysilicon gate to an ashing environment further comprises the steps of:

introducing $CF_4$ into said ashing environment at a flow rate of approximately 180 SCCM; and introducing $H_2O$ vapor into said ashing environment at a flow rate of approximately 300 SCCM such that said impurities introduced into said source and drain diffusion regions of said semiconductor substrate and into said top surface of said polysilicon gate during said formation of said sidewall oxide spacers are removed.

18. The method as recited in claim 15 further comprising the step of:

performing a semiconductor wafer surface clean step.

19. The method as recited in claim 18 further comprising the step of:

performing said surface clean step using an HF dip.

* * * * *